United States Patent [19]
Sundaram et al.

[11] Patent Number: 5,372,967
[45] Date of Patent: Dec. 13, 1994

[54] METHOD FOR FABRICATING A VERTICAL TRENCH INDUCTOR

[75] Inventors: Lalgudi M. G. Sundaram, Scottsdale; Neil Tracht, Mesa, both of Ariz.

[73] Assignee: Motorola, Inc., Schaumburg, Ill.

[21] Appl. No.: 236,079

[22] Filed: May 2, 1994

Related U.S. Application Data

[62] Division of Ser. No. 826,553, Jan. 27, 1992, Pat. No. 5,336,921.

[51] Int. Cl.$^5$ .................. H01L 21/70; H01L 27/00
[52] U.S. Cl. .................... 437/60; 437/187; 437/195; 437/203; 29/602.1; 336/200; 336/223
[58] Field of Search ............ 437/203, 228, 186–187, 437/192–195, 60; 156/664; 148/DIG. 50; 29/602.1, 625, 825; 365/145, 149, 173; 257/295, 306, 310; 336/200, 223

[56] References Cited

U.S. PATENT DOCUMENTS

| | | | |
|---|---|---|---|
| 3,881,244 | 5/1975 | Kendall | 29/602 |
| 4,286,374 | 9/1981 | Hantusch | 437/203 |
| 4,507,853 | 4/1985 | McDavid | 437/187 |

*Primary Examiner*—George Fourson
*Assistant Examiner*—H. Jey Tsai
*Attorney, Agent, or Firm*—Kevin B. Jackson

[57] ABSTRACT

A method of forming vertical trench inductor (10) includes providing a layer (11) and forming a plurality of trenches (12) vertically therein. The trenches (12) are filled with a conductive material (16) and etched using a photolithographically defined mask (17). The etching produces a conductive liner (18) covering two sidewalls (13) and a bottom surface (14) of the trench (12). A second conductive layer is formed and patterned to couple the conductive liner (18) covering a sidewall (13) of a first trench (12) to the conductive liner (18) of an opposite sidewall (13) of an adjacent trench (12) to form an inductive coil.

18 Claims, 3 Drawing Sheets

METHOD FOR FABRICATING A VERTICAL TRENCH INDUCTOR

This is a division of application Ser. No. 07/826,553, filed Jan. 27, 1992, U.S. Pat. No. 5,336,921.

FIELD OF THE INVENTION

This invention relates, in general, to semiconductor devices and more particularly to a method of making semiconductor devices having vertical trench inductors and a method of fabrication.

BACKGROUND OF THE INVENTION

It is known in the semiconductor arts to fabricate inductors using thin film structures. Metal thin film inductors generally are formed in spiral or rectangular snake patterns on the surface of an integrated circuit.

Conventional inductors and methods of fabrication generally work well although there are inherent problems. For example, most conventional inductor fabrication is photolithographically defined. Because photolithography includes inherent scaling tolerances and limitations, it is exceedingly difficult to form submicron inductors. Further, because the inductor layout is basically horizontal, large surface area is required. This places severe limitations on the scaling of integrated circuits, increases cost of the integrated circuit, and reduces functionality.

The inductance value which can be achieved by a given inductor structure is a function of its length and the number of turns or coils which can be fabricated in the structure. Horizontal inductor structures become large very rapidly as the length and number of turns increases, thus large inductance values cannot be achieved using horizontal structures.

Another problem with horizontal structures, is that they are difficult to integrate with high permeability core material to provide efficient coupling of magnetic flux between inductor structures. Magnetic coupling is necessary to form a number of electromagnetic devices such as solenoids and transformers. Thus, horizontal inductor structures have limited application.

In view of the above, it would be highly desirable to fabricate vertical trench inductors that require reduced surface area and enable maximum scaling of integrated circuits.

SUMMARY OF THE INVENTION

Briefly stated, a method of fabricating vertical trench inductor includes providing a first layer and forming a plurality of trenches vertically therein. The trenches are filled with a conductive material and etched using a photolithographically defined mask. The etching produces a conductive liner covering two sidewalls and a bottom surface of the trench. A second conductive layer is formed and patterned to couple the conductive liner covering a sidewall of a first trench to the conductive liner of an opposite sidewall of an adjacent trench to form an inductive coil.

As used herein, high permeability means high magnetic permeability or low resistance to magnetic flux.

DETAILED DESCRIPTION OF THE DRAWINGS

Figure 1:
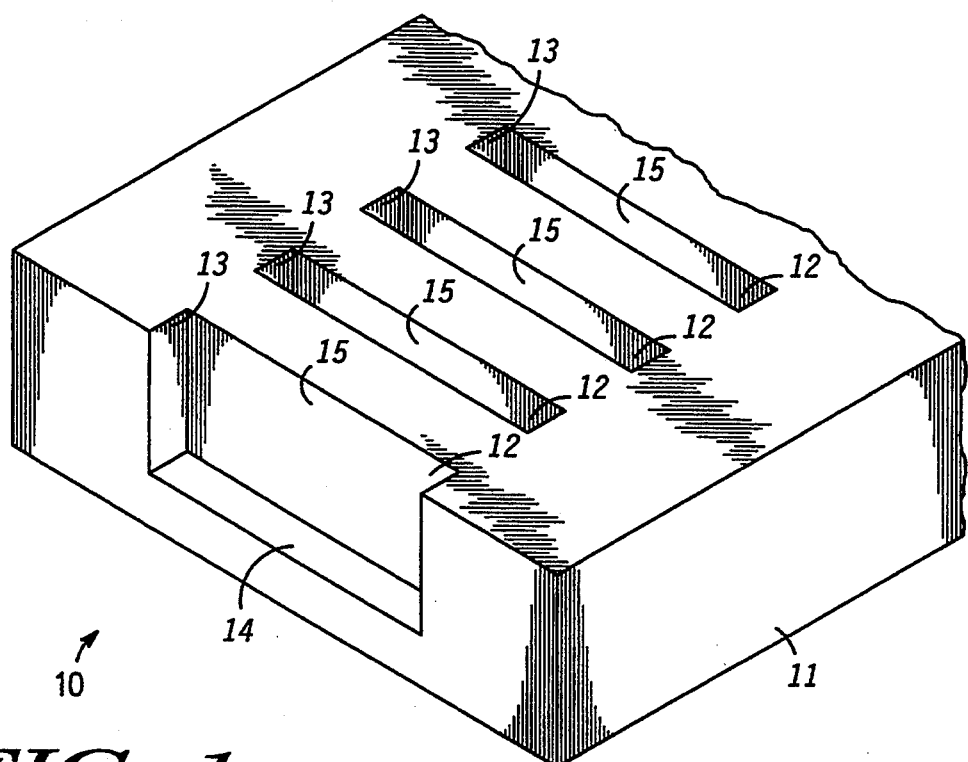
FIG. 1 is a highly enlarged cross-sectional view of a vertical trench inductor structure in accordance with the present invention at an early stage in processing.

FIG. 1 is a highly enlarged cross-sectional view of a vertical trench inductor structure in accordance with the present invention at an early stage in processing. It should be understood that structure 10 is merely exemplary and that the present invention may be employed in many different structures and integrated circuits not specifically depicted herein. Structure 10 includes a layer 11 which is preferably electrically insulating. Layer 11 comprises silicon oxide, silicon nitride, an organic insulator, or the like. Layer 11 may also comprise a semiconductor material, such as silicon.

A plurality of trenches 12 are formed in layer 11. Each trench 12 comprises a first set of opposed sidewalls 13, a second set of opposed sidewalls 15 and a bottom surface 14. Sidewalls 13 may be at right angles to sidewalls 15 where trench 12 is square or rectangular in shape. If layer 11 comprises a semiconductor material, it is advantageous to line sidewalls 13 and bottom surface 14 with a dielectric material, so that the interior of each trench 12 is electrically isolated from layer 11. For ease of illustration, trenches 12 are illustrated as rectangular in shape and arranged in a linear pattern with respect to each other. It should be apparent that other trench shapes are possible. Likewise, the trenches can be arranged in spiral, or rectangular snake patterns also.

Figure 2:
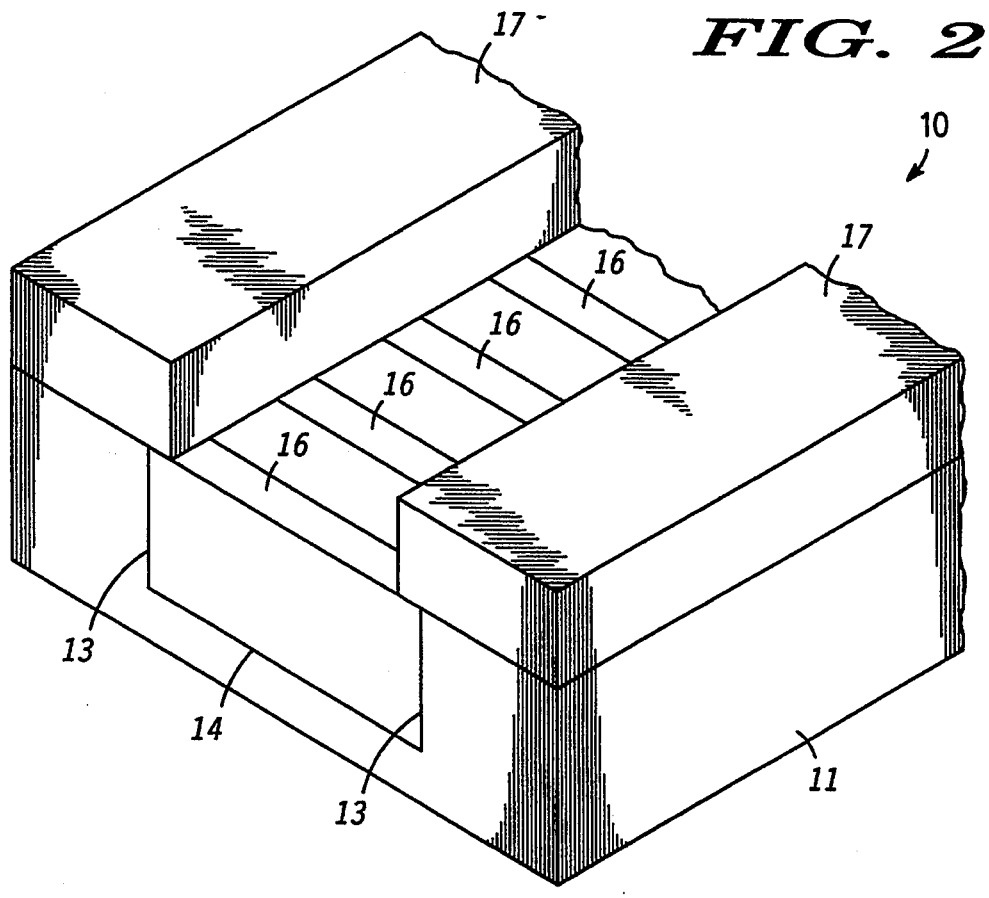
FIG. 2 illustrates the structure shown in FIG. 1 at a further stage in processing.

As shown in FIG. 2, trenches 12 are filled with a conductive material 16. Conductive material 16 may comprise aluminum or an aluminum alloy, doped semiconductor such as polysilicon, or the like. It is desirable to deposit conductive material 16 as a blanket layer and subsequently planarize the conductive material 16 so that conductive material 16 just fills trenches 12, creating a planar top surface for structure 10. Blanket deposition and planarization techniques are well known in the semiconductor industry. Mask 17 is formed and patterned to cover an upper surface of layer 11 and extend beyond first opposed sidewalls 13 of trenches 12. Mask 17 is stripe shaped so that a portion of conductive material 16 is covered by mask 17. Major portions of second opposed sidewalls 15 are not covered by mask 17.

Figure 3:
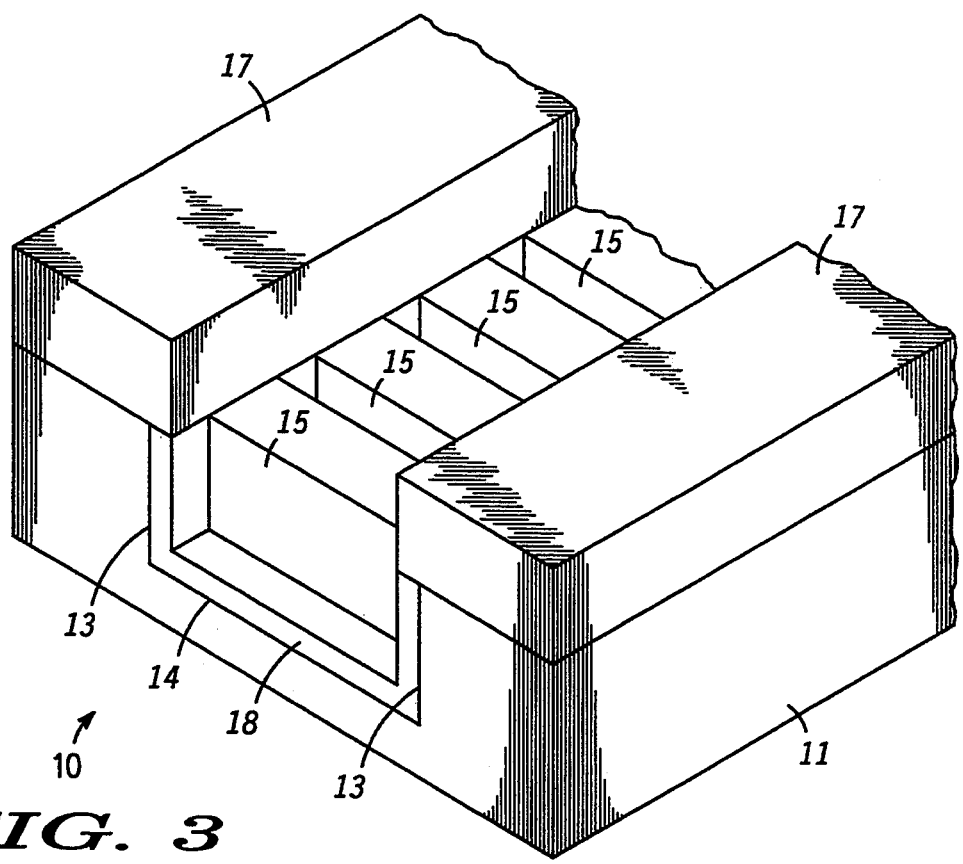
FIG. 3 shows the structure of FIG. 2 still further along in processing.

Conductive layer 16 is then anisotropically etched to produce a U-shaped conductor lining each trench 12, as shown in FIG. 3. Conductive material 16 is removed from second opposed sidewalls 15 and from an interior portion of each trench 12. Conductive liners 18 are formed in each trench 12 on first opposed sidewalls 13. The anisotropic etch is timed so that conductive liner 18 remains on bottom surface 14. While thickness and uniformity of thickness of conductive liner 18 is not believed to be critical, state of the art photolithography and etching techniques can provide reasonable thickness uniformity.

As an example, trenches 12 may be 0.8 micrometer wide, where width is the spacing between second opposed sidewalls 15. Trenches 12 may be as little as 0.8 micrometer in length where length is the spacing between first opposed sidewalls 13. Length can be much larger, however, and ordinarily will be several microns depending on space constraints and desired inductance. Trenches 12 may be 1.0 micrometer deep. Thickness of conductive liner 18 may be 0.1–0.2 micrometers, for example.

Figure 4:
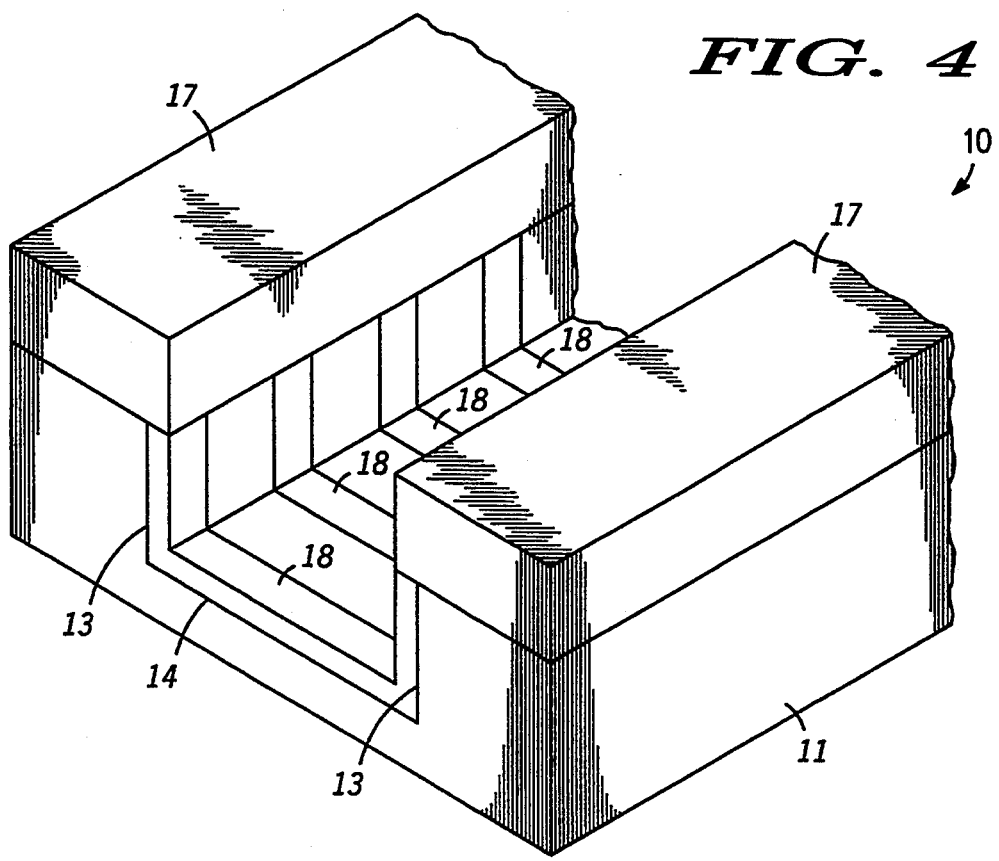
FIG. 4 illustrates an optional process performed on the structure shown in FIG. 3.

FIG. 4 illustrates an optional process step of etching the portions of layer 11 which lie between adjacent trenches using mask 17. This optional step results in removal of sidewalls 15 entirely. The purpose of this optional etch step is described in more detail in reference to FIG. 5.

Figure 5:
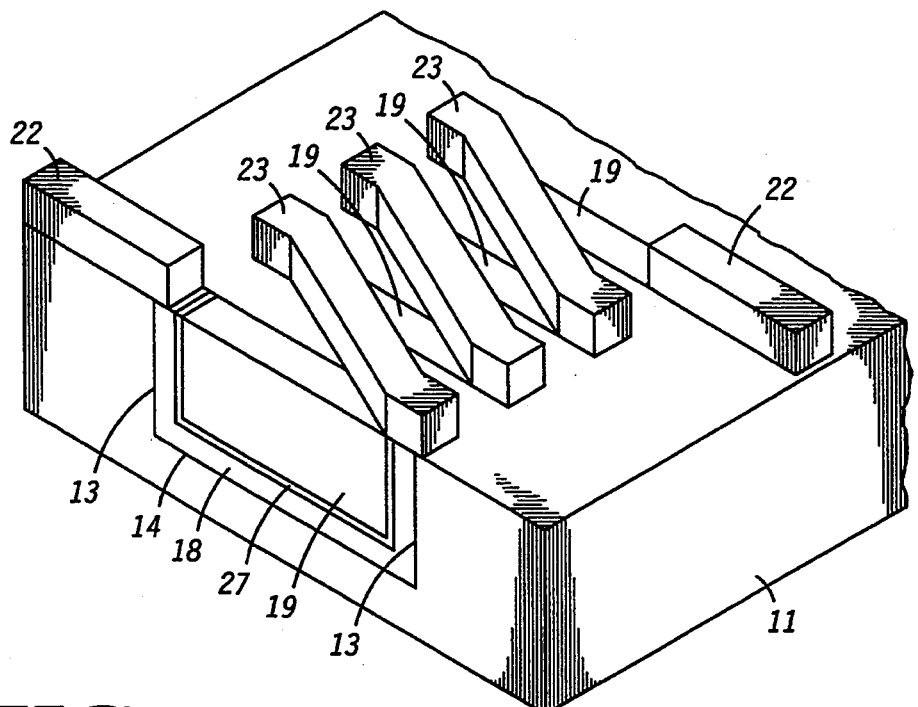
FIG. 5 illustrates the structure shown in FIGS. 1-3 at a late stage of processing.

As shown in FIG. 5, the interior portion of trenches 12 is filled with a core material 19. Core material 19 comprises a dielectric, or in an alternative embodiment comprises a high permeability magnetic material such as a ferrite, isolated from conductive liner 18 by a dielectric liner 27. Dielectric liner 27 can be formed using well known thin film deposition techniques. Core material 19 can be deposited using thin or thick film deposition techniques. In the preferred embodiment, core material 19 is planarized after deposition so that it is flush with the upper surface of layer 11.

If the optional etch step described in reference to FIG. 4 is performed, and followed by the deposition of dielectric liner 27, core material 19 will form a continuous, unbroken core for inductor structure 10. This may be advantageous in certain applications, and provide a maximum permeability path for inductor structure 10. This may be useful where the trench inductor of the present invention is used to form a solenoid or a transformer. The structure shown in FIG. 4 will result in an inductor structure 10 which is like a solid-core type of electromagnetic device. In contrast, the structure shown in FIG. 5 will result in an inductor structure 10 which is like laminated-core type electromagnetic devices. It is known that laminated-core type electromagnetic devices are more efficient in certain applications than solid core devices because laminated-core type devices suppress eddy currents in core material 19.

Interconnects 23 are formed and patterned from a conductive layer using conventional thin film deposition and patterning techniques. In the preferred embodiment, interconnects 23 comprise aluminum alloy, but any conductive material is acceptable. Interconnects 23 couple one end of a conductive liner 18 in a first trench 12 to an opposite end of conductive liner 18 in an adjacent trench 12. Conductive liners 18, coupled as described by interconnects 23, form loops or coils of inductor structure 10. Any number of loops or coils can thus be formed. Conductive pads 22 are for interconnecting inductor structure 10 to other circuitry (not shown). It should be understood that additional pads 22 can be coupled to any or all of interconnects 23. In this manner, variable inductances can be provided from a single structure.

Because inductor structures 10, shown in FIG. 5 is substantially planar, additional inductor structures 10 can easily be stacked on top of each other and interconnected using conventional multilayer metal processing. Stacked inductors simply require that the structure shown in FIG. 5 be covered with a dielectric film (not shown) which then serves as a layer 11 for a subsequent inductor structure 10 formed in the manner set out hereinbefore.

Figure 6:
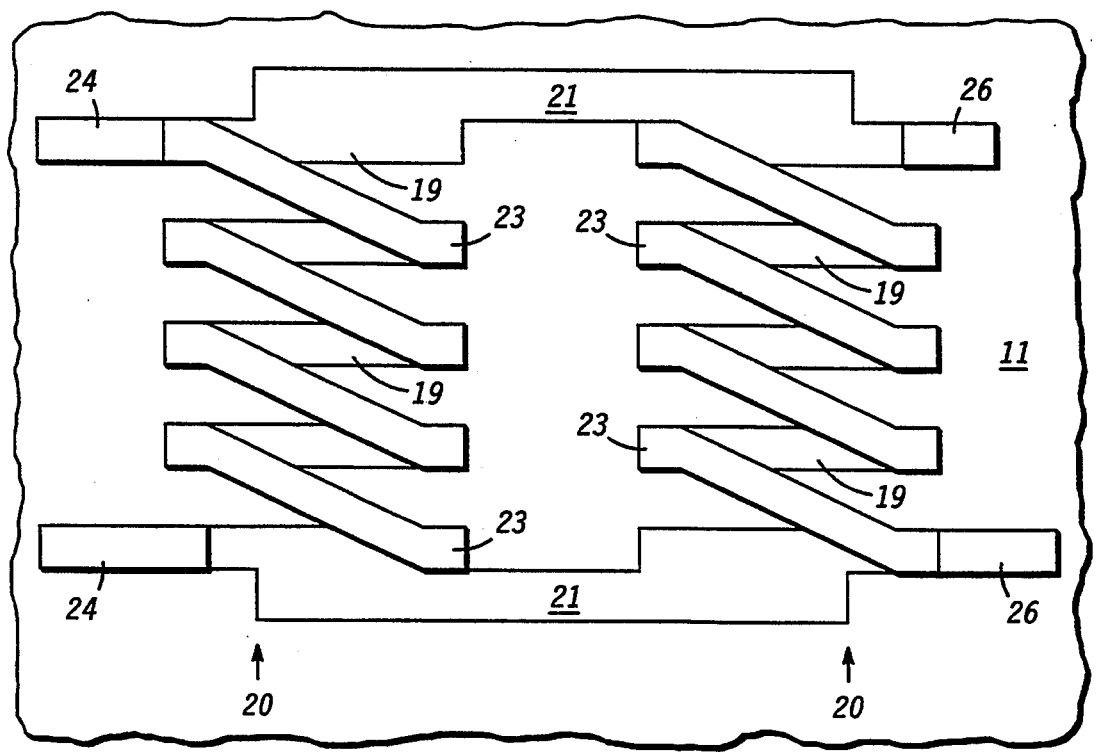
FIG. 6 illustrates a top view of an integrated transformer using the trench inductor of the present invention.

FIG. 6 illustrates a top view of useful application of the trench inductor in accordance with the present invention. Inductor structures 20 are similar to the inductor structure 10 shown in FIG. 5. Structures which are the same as shown in FIG. 5 are designated with the same reference numerals. In this embodiment, inductors 20 are magnetically coupled by yokes 21 which comprise trenches filled with a high permeability material. Each trench inductor structure uses a high permeability core material 19. For purposes of description, each trench inductor structure 20 has a top end located near the top of FIG. 6 and a bottom end located near the bottom of FIG. 6, although it should be understood that for most purposes structures 20 are symmetrical. In other word, there is no electrical difference between the top ends and the bottom ends of inductor structures 20.

One yoke 21 couples core material 19 at the top ends of each inductor structure 20. A second yoke 21 couples to core material 19 at bottom ends of inductor structures 20. Yokes 21 can be formed at the same time as trenches 12 described earlier, and filled with the same material as is used for core material 19. It should be understood that yokes 21 may take a variety of shapes to achieve a desired coupling between inductor structures 20, as is understood in the transformer design arts.

The two magnetically coupled inductor structures 20 form a transformer. A primary "winding" is coupled to external circuitry via pads 24. A secondary winding is coupled to external circuitry by pads 26. The transformer structure shown in FIG. 6 is useful for isolating circuitry formed on the same integrated circuit as inductor structures 20, as well as for multiplication of alternating currents and voltages. It should be noted that although previous horizontal inductor structures have been made, the nature of a horizontal structure militates against efficient magnetic coupling necessary to form an integrated transformer.

Thus it is apparent that there has been provided, in accordance with the invention, an improved vertical trench inductor and method which utilizes reduced amounts of surface area and can be integrated with conventional semiconductor circuitry. The inductor structure in accordance with the present invention can provide large inductance values, and can easily be interconnected to form transformers, solenoids, and other electromagnetic devices. Although specific embodiments of the present invention have been shown and described, further modifications and improvements will occur to those of skill in the art. It is desired that it be understood, therefore, that this invention is not limited to the particular forms shown and it is intended in the appended claims to cover all modifications which do not depart from the spirit and scope of this invention.

We claim:

1. A method of fabricating a vertical trench inductor comprising the steps of:

providing a layer to have a conductive region formed therein;

forming a plurality of trenches vertically into the layer, wherein each trench has a bottom surface, a first set of opposed sidewalls, and a second set of opposed sidewalls;

filling each trench with a conductive material;

etching the conductive material to remove the conductive material from the second set of opposed sidewalls thereby forming a conductive liner covering the bottom surface and the first set of opposed sidewalls;

covering the conductive liner with a dielectric material; and forming a conductive interconnect to couple one end of the conductive liner in a first trench to an opposite end of the conductive liner in an adjacent trench.

2. The method of claim 1 wherein the providing a layer step comprises providing an insulating layer on a semiconductor substrate.

3. The method of claim 1 wherein providing a layer step comprises providing a semiconductor layer, and further comprising lining the bottom surface and the first and second set of opposed sidewalls with a dielectric material after the step of forming the trenches.

4. The method of claim 1 wherein the covering the conductive liner with a dielectric step further comprises providing a dielectric liner covering the conductive liner and the method further comprises the step of covering the dielectric liner with a high permeability core material.

5. The method of claim 1 wherein the etching the conductive material step further comprises forming a mask layer which extends over the first set of opposed sidewalls and anisotropically etching the conductive material.

6. The method of claim 5 further comprising the step of removing material between adjacent trenches using the mask layer as an etch mask after the etching the conductive material step.

7. A method for fabricating a vertical trench inductor comprising the steps of:

providing a first layer;

forming a plurality of trenches vertically into the first layer, wherein each trench has a bottom surface, a first set of opposed sidewalls, and a second set of opposed sidewalls;

depositing a blanket layer comprising a conductive material, wherein the blanket layer fills the plurality of trenches and covers the first layer;

planarizing the blanket layer so that the conductive material just fills the plurality of trenches;

forming a mask layer which extends over the first set of opposed sidewalls;

etching the conductive material to remove the conductive material from the second set of opposed sidewalls thereby forming a conductive liner covering the bottom surface and the first set of opposed sidewalls;

covering the conductive liner with a dielectric material; and forming a conductive interconnect to couple one end of the conductive liner in a first trench to an opposite end of the conductive liner in an adjacent trench.

8. The method of claim 7 wherein the step of providing the first layer comprises providing an insulating layer on a semiconductor substrate.

9. The method of claim 7 wherein the step of providing the first layer comprises providing a semiconductor layer and further comprising the step of lining the bottom surface and the first and the second set of opposed sidewalls of each trench with a dielectric material after the step of forming the trenches.

10. The method of claim 7 wherein the step of depositing the blanket layer comprising the conductive material comprises depositing a blanket layer selected from the group consisting of aluminum, aluminum alloy, and doped polysilicon.

11. The method of claim 7 further comprising the step of removing portions of the first layer between adjacent trenches using the mask layer as an etch mask after the step of etching the conductive material.

12. The method of claim 11 wherein the step of covering the conductive liner with the dielectric further comprises providing a dielectric liner covering the conductive liner and the method further comprises the step of covering the dielectric liner with a high permeability core material.

13. A process for making a vertical trench inductor comprising the steps providing an insulating layer;

forming a plurality of trenches vertically into the insulating layer, wherein each trench has a bottom surface, a first set of opposed sidewalls, and a second set of opposed sidewalls;

depositing a blanket layer comprising a conductive material, wherein the blanket layer fills the plurality of trenches and covers the insulating layer;

planarizing the blanket layer so that the conductive material just fills the plurality of trenches;

forming a mask layer which extends over the first set of opposed sidewalls;

etching the conductive material to remove the conductive material from the second set of opposed sidewalls thereby forming a conductive liner covering the bottom surface and the first set of opposed sidewalls;

covering the conductive liner with a dielectric material; and forming a conductive interconnect to couple one end of the conductive liner in a first trench to an opposite end of the conductive liner in an adjacent trench.

14. The process of claim 13 further comprising the step of planarizing the dielectric material after the step of covering the conductive liner with the dielectric material so that the dielectric layer is flush with an upper surface of the insulating layer.

15. The process of claim 13 further comprising the step of removing portions of the insulating layer between adjacent trenches using the mask layer as an etch mask after the step of etching the conductive material.

16. The process of claim 15 wherein the step of covering the conductive liner with the dielectric further comprises providing a dielectric liner covering the conductive liner and the method further comprises the steps of covering the dielectric liner with a high permeability core material and planarizing the high permeability core material so that it is flush with an upper surface of the insulating layer.

17. The process of claim 13 wherein the step of providing the insulating layer comprises providing a layer selected from the group consisting of silicon oxide, silicon nitride, and an organic insulator.

18. The process of claim 13 wherein the step of forming the plurality of trenches into the insulating layer comprises forming the plurality of trenches into the insulating layer so that the first set of opposed sidewalls form right angles with respect to the second set of opposed sidewalls.

* * * * *